(12) United States Patent
Deng

(10) Patent No.: US 10,541,366 B2
(45) Date of Patent: Jan. 21, 2020

(54) FLEXIBLE TFT SUBSTRATE HAVING A PLURALITY OF GROOVES IN ORGANIC MATERIAL

(71) Applicant: TCL China Star Optoelectronics Technology Co., Ltd., Shenzhen (CN)

(72) Inventor: Jinquan Deng, Shenzhen (CN)

(73) Assignee: TCL CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 385 days.

(21) Appl. No.: 15/329,240

(22) PCT Filed: Dec. 27, 2016

(86) PCT No.: PCT/CN2016/112259
§ 371 (c)(1),
(2) Date: Jan. 25, 2017

(87) PCT Pub. No.: WO2018/086211
PCT Pub. Date: May 17, 2018

(65) Prior Publication Data
US 2018/0337332 A1    Nov. 22, 2018

(30) Foreign Application Priority Data
Nov. 11, 2016  (CN) .......................... 2016 1 1005581

(51) Int. Cl.
*H01L 21/00*       (2006.01)
*H01L 51/40*       (2006.01)
(Continued)

(52) U.S. Cl.
CPC ............ *H01L 51/00* (2013.01); *H01L 21/673* (2013.01); *H01L 27/3248* (2013.01);
(Continued)

(58) Field of Classification Search
CPC ... H01L 51/00; H01L 21/673; H01L 27/3276; H01L 27/3248; H01L 27/3262
See application file for complete search history.

(56) References Cited

U.S. PATENT DOCUMENTS 10,268,094 B1 *   4/2019   Deng ................ G02F 1/136286
2008/0012022 A1 * 1/2008   Moriwaki ............ H01L 29/458
                                                            257/72
(Continued)

FOREIGN PATENT DOCUMENTS

CN    203883009 U    10/2014
CN    105206763 A    12/2015

*Primary Examiner* — Alonzo Chambliss
(74) *Attorney, Agent, or Firm* — Leong C. Lei

(57) ABSTRACT

The invention provides a flexible TFT substrate and manufacturing method thereof. The method forms a flexible base and a first organic layer on rigid substrate and forms a plurality of grooves, manufactures TFT devices in the grooves and forms a second organic layer on the first organic layer, finally peels the flexible base from the rigid substrate to obtain a flexible TFT substrate, wherein because a plurality of grooves is disposed in the first organic layer, a plurality of recessed structures and raised structures are formed on the first organic layer so that the second organic layer and the first organic layer are engaged with each other and bonded tightly, and protects the TFT devices sandwiched between the two to prevent the breaking wires, TFT peeling, and leaking light in the bending process, to enhance the flexible TFT substrate quality to prolong the lifespan of flexible TFT substrate.

8 Claims, 9 Drawing Sheets

(51) Int. Cl.
*H01L 29/08* (2006.01)
*H01L 31/0232* (2014.01)
*H01L 51/00* (2006.01)
*H01L 21/673* (2006.01)
*H01L 27/32* (2006.01)

(52) U.S. Cl.
CPC ...... *H01L 27/3262* (2013.01); *H01L 27/3276* (2013.01); *H01L 2924/00* (2013.01)

(56) References Cited

U.S. PATENT DOCUMENTS

| | | | |
|---|---|---|---|
| 2012/0190143 A1* | 7/2012 | Lee | H01L 27/1288 438/34 |
| 2016/0380009 A1* | 12/2016 | Deng | H01L 27/1288 257/72 |

* cited by examiner

FLEXIBLE TFT SUBSTRATE HAVING A PLURALITY OF GROOVES IN ORGANIC MATERIAL

BACKGROUND OF THE INVENTION

1. Field of the Invention

The present invention relates to the field of display techniques, and in particular to a flexible thin film transistor (TFT) substrate and manufacturing method thereof.

2. The Related Arts

As the display technology progresses, the liquid crystal display (LCD) and organic light-emitting diode (OLED) displays are widely used because of the advantages of high display quality, low power-consumption, and thinness, in applications, such as mobile phones, TV, PDA, digital cameras, notebook PC, desktop PC, and so on consumer products and becomes the mainstream of the display device.

Most of the LCDs on the current market are of backlight type, which comprises an LCD panel and a backlight module. The operation theory behind LCD is to inject the liquid crystal (LC) molecules between two parallel glass substrates, and a plurality of vertical and horizontal tiny wires is disposed between the two parallel glass substrates. By applying a driving voltage between the two substrates to control the rotation direction of the LC molecules to refract the light from the backlight module to generate the display on the screen.

The current LCD usually comprises: a color filter (CF) substrate, a TFT substrate, an LC sandwiched between the CF substrate and the TFT substrate, and a sealant. The manufacturing process usually comprises: an array process at the beginning (i.e., thin film, lithography, etching and stripping), followed by a cell process in the middle (attaching TFT substrate and CF substrate), and then an liquid crystal module (LCM) process at the end (pressing driving integrated circuit (IC) and printed circuit board (PCB) together); wherein the array process is to form the TFT substrate to enable controlling the motion of LC molecules; the cell process is to add LC molecules between the TFT substrate and the CF substrate; and the LCM process is to integrate the driving IC and the PCB to drive the rotation of the LC molecules and display the image.

The OLED display is a flat panel display device and provides the advantages of simple manufacturing process, low cost, low power-consumption, active light-emitting, high emission efficiency, quick response time, thinness, wide operation temperature range, and capability to realize flexible display and large-area full-color display, as well as the capability to match driving IC, and is regarded as the most promising display technology.

An OLED typically comprises a substrate, an anode provided on the substrate, a hole injection layer (HIL) provided on the anode, a hole transport layer (HTL) provided on the hole injection layer, a light-emitting layer (EML) provided on the hole transport layer, an electron transport layer (ETL) provided on the light-emitting layer, an electron injection layer (EIL) provided on the electron transport layer, and a cathode provided on the electron transport layer. The theory of light-emission of OLED display the carrier injection and recombination for the semiconductor materials and organic light-emitting materials under the driving of the electric field. Specifically, the OLED display usually adopts the ITO pixel electrode and the metal electrode as the anode and the cathode. Under the driving of a certain voltage, the electron and the hole are respectively injected from the cathode and the anode into the electron transport layer and the hole transport layer respectively; and the electrons and the holes migrate through the electron transport layer and the hole transport layer respectively to the light-emitting layer to meet in the light emitting layer to form excitons and to excite the light-emitting molecules, which in turn emit visible light by radiation relaxation.

The driving types of OLED can be divided, according to the driving method, into the passive matrix OLED (PMOLED) and active matrix OLED (AMOLED), i.e., the direct addressable type and thin film transistor (TFT) addressable type, wherein the AMOLED provides the advantages of pixels arranged in an array, self-luminous, and high luminous efficiency and is commonly used for high definition large-size display.

The TFT is the main driving component of the known LCD and AMOLED display, and is directly linked to the development direction of high-performance panel display. The flexible TFT substrate has a wider application potential than the known TFT substrate, especially in the smart devices. However, the flexible TFT substrate manufactured by directly applying known TFT substrate manufacturing method to the flexible TFT substrate suffers the shortcomings of prone to broken wires, TFT component peeling and light leakage.

SUMMARY OF THE INVENTION

The object of the present invention is to provide a manufacturing method of flexible TFT substrate, able to prevent the flexible substrate from breaking wires, TFT component peeling, and leaking light during bending, and improve the TFT substrate quality and prolong the lifespan of the flexible TFT substrate.

Another object of the present invention is to provide a flexible substrate, without breaking wires, TFT component peeling, and leaking light during bending, and better quality and the longer lifespan.

To achieve the above object, the present invention provides a manufacturing method of flexible TFT substrate, which comprises:

Step 1: providing a rigid substrate, coating a first organic material on the rigid substrate to form a flexible base;

Step 2: coating a second organic material on the flexible base to form a first organic layer, performing patterning on the first organic layer with a halftone mask to form a plurality of first grooves, a plurality of second grooves, a plurality of third grooves and a plurality of fourth grooves; wherein the first grooves intersecting with the second grooves, the third grooves connected respectively to the first grooves and the second grooves, and the fourth grooves connected to the third grooves;

Step 3: forming a scan line in each first groove, forming a gate in the third groove, the gate being connected to the scan line;

forming a gate insulation layer on the scan line and the gate;

forming an active layer on the gate insulation layer at location corresponding to above the gate;

forming a data line in each second groove, forming a source and a drain in the third groove, the source connected to the data line, the source and the drain connected respectively to the two sides of the active layer;

forming a passivation layer on the data line, the source, the drain, the active layer and bottom of the fourth groove, forming a first via on the passivation layer at location corresponding to above the drain;

forming a pixel electrode on the passivation layer at location corresponding to above the bottom of the fourth groove, the pixel electrode contacting the drain through the first via;

Step 4: coating a third organic material on the first organic layer to form a second organic layer;

Step 5: peeling the flexible base from the rigid substrate to obtain a flexible TFT substrate.

According to a preferred embodiment of the present invention, the bottoms of the first groove, the second groove, the third groove and the fourth groove are located in the first organic layer or the interface between the flexible base and the first organic layer, the first groove, the second groove, the third groove and the fourth groove have the same or different depth.

Preferably, Step 2 further comprises: forming a plurality of fifth grooves on the first organic layer, the fifth grooves being connected to none, one or more of the first groove, the second groove, the third groove and the fourth groove, the bottom of the fifth groove being located in the first organic layer or the interface between the flexible base and the first organic layer, and the fifth groove having the same with none, one or more of the first groove, the second groove, the third groove and the fourth groove.

According to a preferred embodiment of the present invention, the first organic material, the second organic material and the third organic material comprise respectively at least one of polycarbonate, polyethylene terephthalate, polyethylene naphthalate, polyether resin, and polyimide; and the first organic material is the same as the second organic material, the coating process in Step 1 is the same as the coating process in Step 2.

Preferably, Step 4 further comprises: performing patterning on the second organic layer with a halftone mask to form a sixth groove on the second organic layer at location corresponding to above the pixel electrode, thinning the thickness of the second organic layer above the pixel electrode.

Another embodiment of the present invention provides a flexible TFT substrate, which comprises: a flexible base, a first organic layer disposed on the flexible base, and a second organic layer disposed on the first organic layer;

the first organic layer being disposed with a plurality of first grooves, a plurality of second grooves, a plurality of third grooves and a plurality of fourth grooves; wherein the first grooves intersecting with the second grooves, the third grooves connected respectively to the first grooves and the second grooves, and the fourth grooves connected to the third grooves;

inside of the third groove being disposed with a gate, gate insulation layer, an active layer, a source and a drain, and a passivation layer from the bottom up in a stack structure, the active layer being disposed corresponding to above the gate, the source and the drain contacting the two sides of the active layer respectively;

inside of the first groove being disposed with a scan line and a gate insulation layer from the bottom up in a stack structure, the scan line being connected to the gate;

inside of the second groove being disposed with a data line and a passivation layer from the bottom up in a stack structure, the data line being connected to the source;

inside of the fourth groove being disposed with a passivation layer and a pixel electrode from the bottom up in a stack structure; the passivation layer being disposed with a first via at location corresponding to above the drain, the pixel electrode contacting the drain through the first via.

According to a preferred embodiment of the present invention, the bottoms of the first groove, the second groove, the third groove and the fourth groove are located in the first organic layer or the interface between the flexible base and the first organic layer, the first groove, the second groove, the third groove and the fourth groove have the same or different depth.

Preferably, the first organic layer is disposed with a plurality of fifth grooves, the fifth groove is connected to none, one or more of the first groove, the second groove, the third groove and the fourth groove, the bottom of the fifth groove is located in the first organic layer or the interface between the flexible base and the first organic layer, and the fifth groove has the same with none, one or more of the first groove, the second groove, the third groove and the fourth groove.

Preferably, the second organic layer is disposed with a sixth groove at location corresponding to above the pixel electrode.

According to a preferred embodiment of the present invention, the flexible base, the first organic layer, and the second organic layer are respectively made of at least one of polycarbonate, polyethylene terephthalate, polyethylene naphthalate, polyether resin, and polyimide; and the first organic material is the same as the second organic material.

Yet another embodiment of the present invention provides a manufacturing method of flexible TFT substrate, which comprises:

Step 1: providing a rigid substrate, coating a first organic material on the rigid substrate to form a flexible base;

Step 2: coating a second organic material on the flexible base to form a first organic layer, performing patterning on the first organic layer with a halftone mask to form a plurality of first grooves, a plurality of second grooves, a plurality of third grooves and a plurality of fourth grooves; wherein the first grooves intersecting with the second grooves, the third grooves connected respectively to the first grooves and the second grooves, and the fourth grooves connected to the third grooves;

Step 3: forming a scan line in each first groove, forming a gate in the third groove, the gate being connected to the scan line;

forming a gate insulation layer on the scan line and the gate;

forming an active layer on the gate insulation layer at location corresponding to above the gate;

forming a data line in each second groove, forming a source and a drain in the third groove, the source connected to the data line, the source and the drain connected respectively to the two sides of the active layer;

forming a passivation layer on the data line, the source, the drain, the active layer and bottom of the fourth groove, forming a first via on the passivation layer at location corresponding to above the drain;

forming a pixel electrode on the passivation layer at location corresponding to above the bottom of the fourth groove, the pixel electrode contacting the drain through the first via;

Step 4: coating a third organic material on the first organic layer to form a second organic layer;

Step 5: peeling the flexible base from the rigid substrate to obtain a flexible TFT substrate;

wherein the bottoms of the first groove, the second groove, the third groove and the fourth groove being located in the first organic layer or the interface between the flexible base and the first organic layer, the first groove, the second groove, the third groove and the fourth groove having the same or different depth;

wherein Step 2 further comprising: forming a plurality of fifth grooves on the first organic layer, the fifth grooves being connected to none, one or more of the first groove, the second groove, the third groove and the fourth groove, the bottom of the fifth groove being located in the first organic layer or the interface between the flexible base and the first organic layer, and the fifth groove having the same with none, one or more of the first groove, the second groove, the third groove and the fourth groove.

Compared to the known techniques, the present invention provides the following advantages. The manufacturing method of flexible TFT substrate provided by the present invention forming a flexible base and a first organic layer on the rigid substrate and forming a plurality of grooves, manufacturing the TFT devices in the grooves and then forming a second organic layer on the first organic layer, finally peeling the flexible base from the rigid substrate to obtain a flexible TFT substrate, wherein because a plurality of grooves is disposed in the first organic layer, a plurality of recessed structures and a plurality of raised structures are formed on the first organic layer so that the second organic layer and the first organic layer are engaged with each other and bonded tightly, and protects the TFT devices sandwiched between the two to prevent the breaking wires, TFT peeling, and leaking light in the bending process, to enhance the flexible TFT substrate quality to prolong the lifespan of flexible TFT substrate.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings:

FIG. 4 is a cross-sectional view of FIG. 3 along the C-C line;

FIG. 6 is a cross-sectional view of FIG. 5 along the C-C line;

DETAILED DESCRIPTION OF THE PREFERRED EMBODIMENTS

To further explain the technique means and effect of the present invention, the following uses preferred embodiments and drawings for detailed description.

Figure 1:
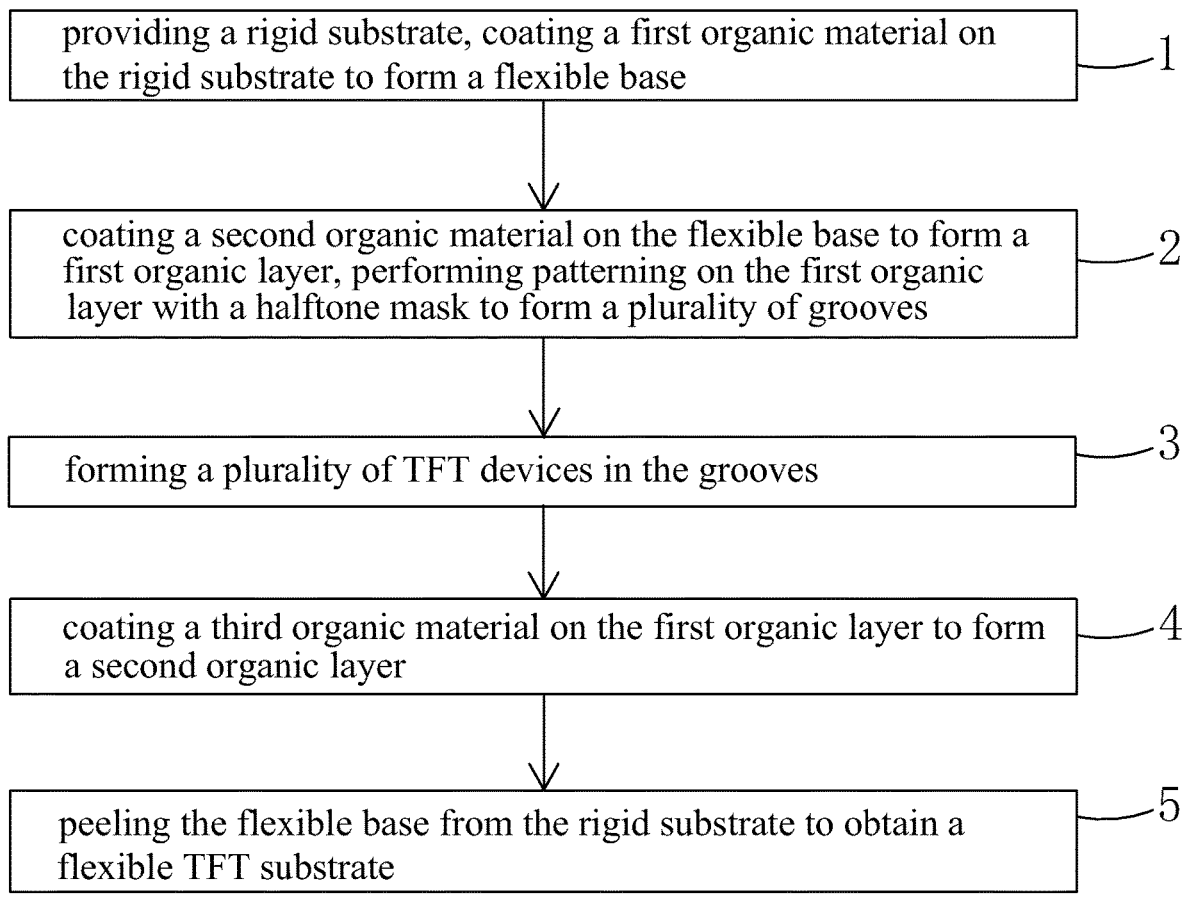
FIG. 1 is a schematic view showing a flowchart of the manufacturing method of flexible TFT substrate provided by an embodiment of the present invention.
Figure 2:
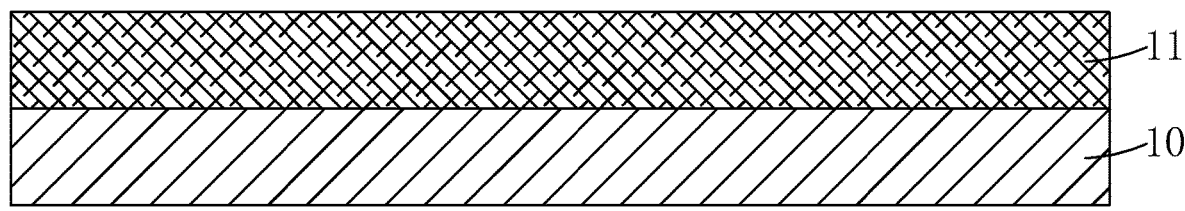
FIG. 2 is a schematic view showing Step 1 of the manufacturing method of flexible TFT substrate provided by an embodiment of the present invention

Referring to FIG. 1, the present invention provides a manufacturing method of flexible TFT substrate, which comprises:

Step 1: as shown in FIG. 2, providing a rigid substrate 10, coating a first organic material on the rigid substrate 10 to form a flexible base 11.

Specifically, the rigid plate 10 is a glass substrate.

Specifically, the first organic material comprises respectively at least one of polycarbonate (PC), polyethylene terephthalate (PET), polyethylene naphthalate (PEN), polyether resin (PES), and polyimide (PI); and preferably, the first organic material comprises polyimide (PI).

Figure 3:
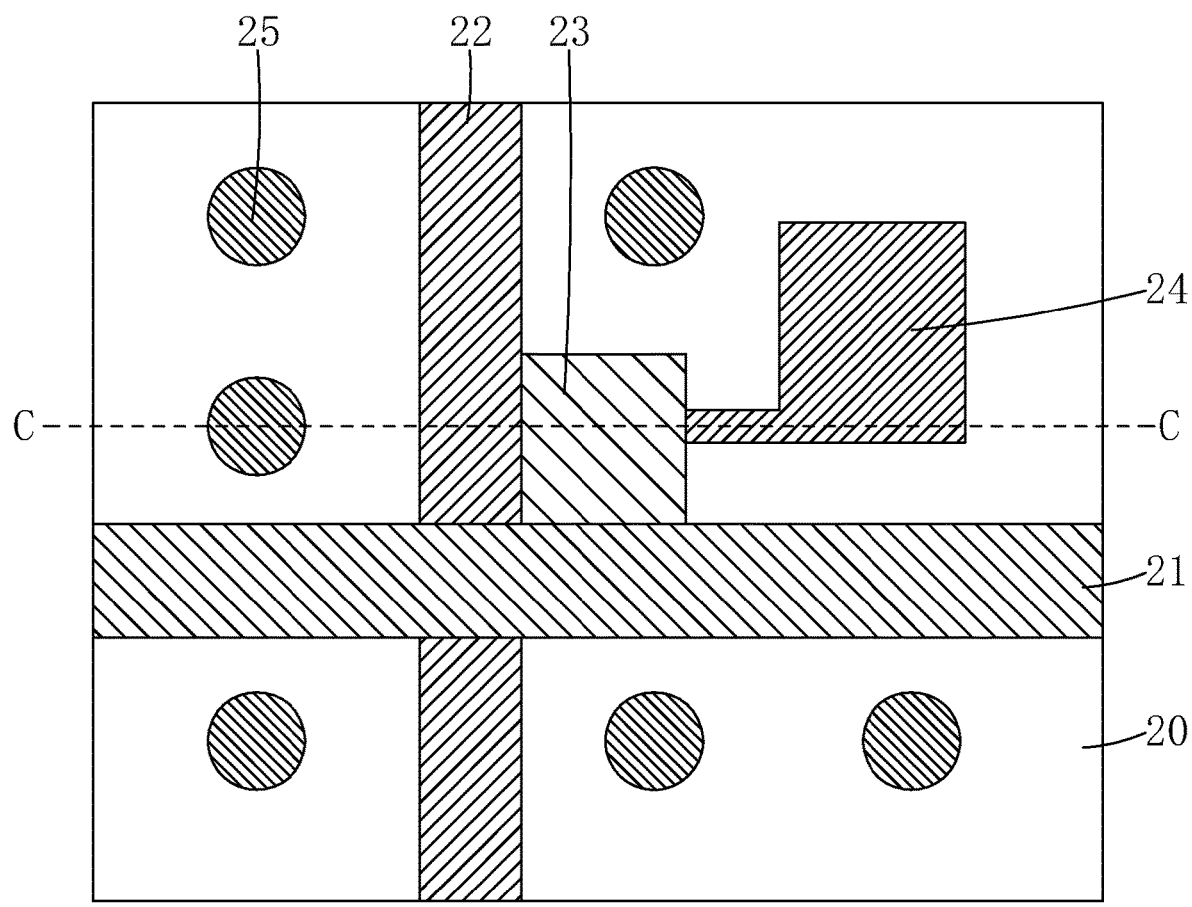
FIG. 3 and FIG. 4 are schematic views showing Step 2 of the manufacturing method of flexible TFT substrate provided by an embodiment of the present invention.
Figure 4:
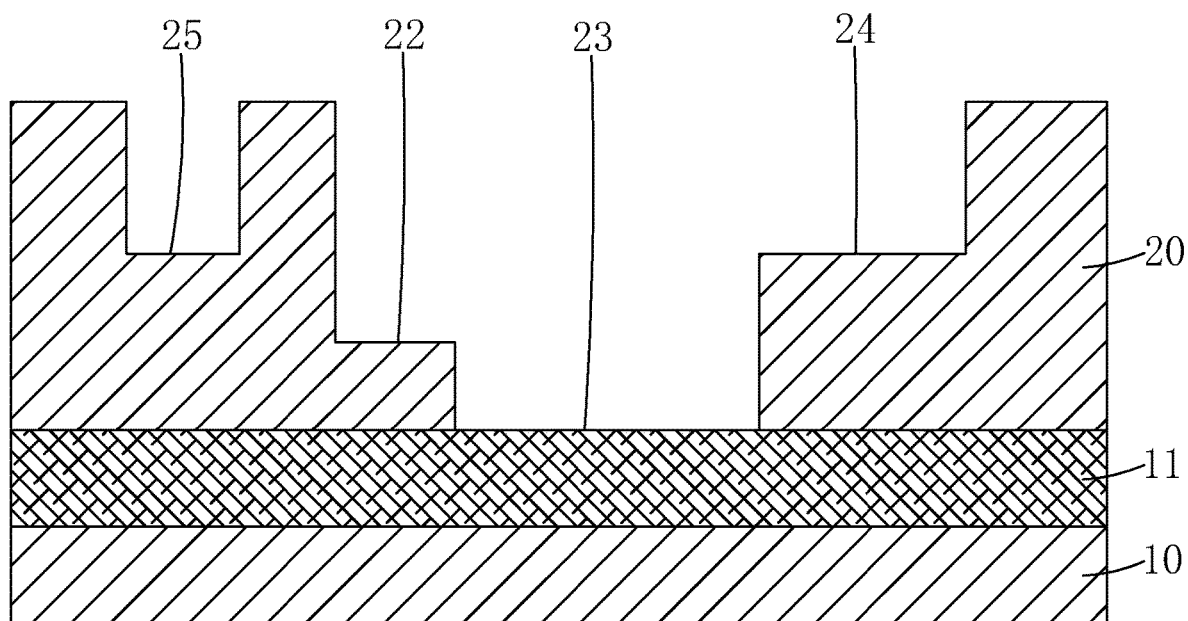

Step 2: as shown in FIG. 3 and FIG. 4, coating a second organic material on the flexible base 11 to form a first organic layer 20, performing patterning on the first organic layer 20 with a halftone mask (not shown) to form a plurality of first grooves 21, a plurality of second grooves 22, a plurality of third grooves 23 and a plurality of fourth grooves 24; wherein the first grooves 21 intersecting with the second grooves 22, the third grooves 23 connected respectively to the first grooves 21 and the second grooves 22, and the fourth grooves 24 connected to the third grooves 23.

Specifically, the first grooves 21 and the second grooves 22 are both bar-shaped, and the first grooves 21 and the second grooves 22 intersect perpendicularly.

Specifically, the third grooves 23 and the fourth grooves 24 are round, triangular or polygonal.

Specifically, the first grooves 21 and the second grooves 22 are used for subsequent deposition of scan lines 31 and data line 51; the third grooves 23 are used for subsequent deposition of a gate 32, an active layer 41, and a source 52 and a drain 53; the fourth grooves 24 are used for subsequent deposition of a pixel electrode 70.

Specifically, the bottoms of the first groove 21, the second groove 22, the third groove 23 and the fourth groove 24 are located in the first organic layer 20 or the interface between the flexible base 11 and the first organic layer 20, the first groove 21, the second groove 22, the third groove 23 and the fourth groove 24 have the same or different depth.

Preferably, the first groove 21 and the third groove 23 have the same depth, and the depth is greater than the depths of the second groove 22 and the fourth groove 24.

Specifically, Step 2 further comprises: forming a plurality of fifth grooves 25 on the first organic layer 20 to increase the number of recessed structures and raised structures so as to a tighter bond between the first organic layer 20 and a second organic layer 80 when the second organic layer 80 is subsequently formed on the first organic layer 20.

Specifically, the fifth groove 25 is connected to none, one or more of the first groove 21, the second groove 22, the third groove 23 and the fourth groove 24, the bottom of the fifth groove 25 is located in the first organic layer 20 or the interface between the flexible base 11 and the first organic layer 20.

Specifically, and the fifth groove 25 has the same with none, one or more of the first groove 21, the second groove 22, the third groove 23 and the fourth groove 24.

Specifically, the fifth grooves 25 are round, triangular or polygonal.

Specifically, the second organic material comprises respectively at least one of polycarbonate (PC), polyethylene terephthalate (PET), polyethylene naphthalate (PEN), polyether resin (PES), and polyimide (PI); and preferably, the second organic material comprises polyimide (PI).

Preferably, the first organic material is the same as the second organic material, and the coating process in Step 1 is the same as the coating process in Step 2 to save the process time.

Figure 5:
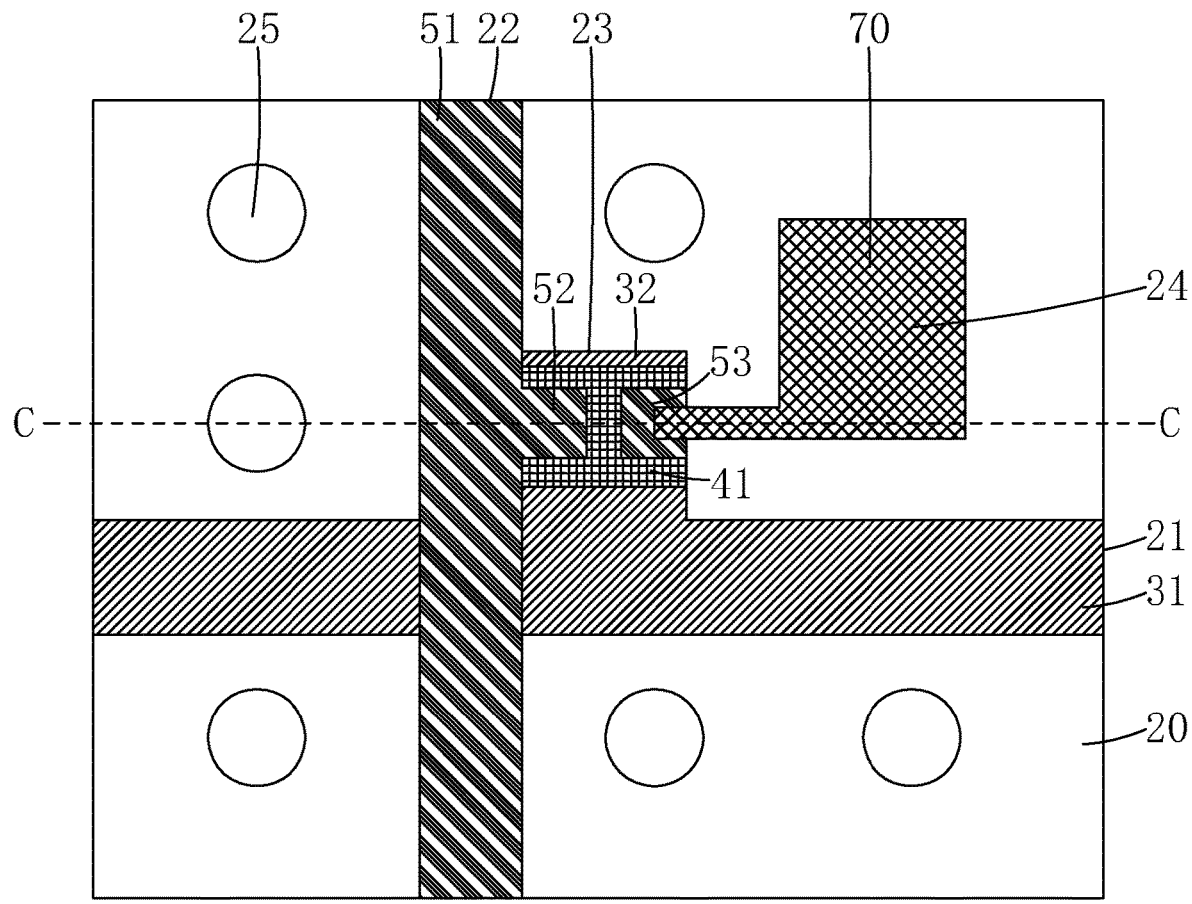
FIG. 5 and FIG. 6 are schematic views showing Step 3 of the manufacturing method of flexible TFT substrate provided by an embodiment of the present invention.
Figure 6:
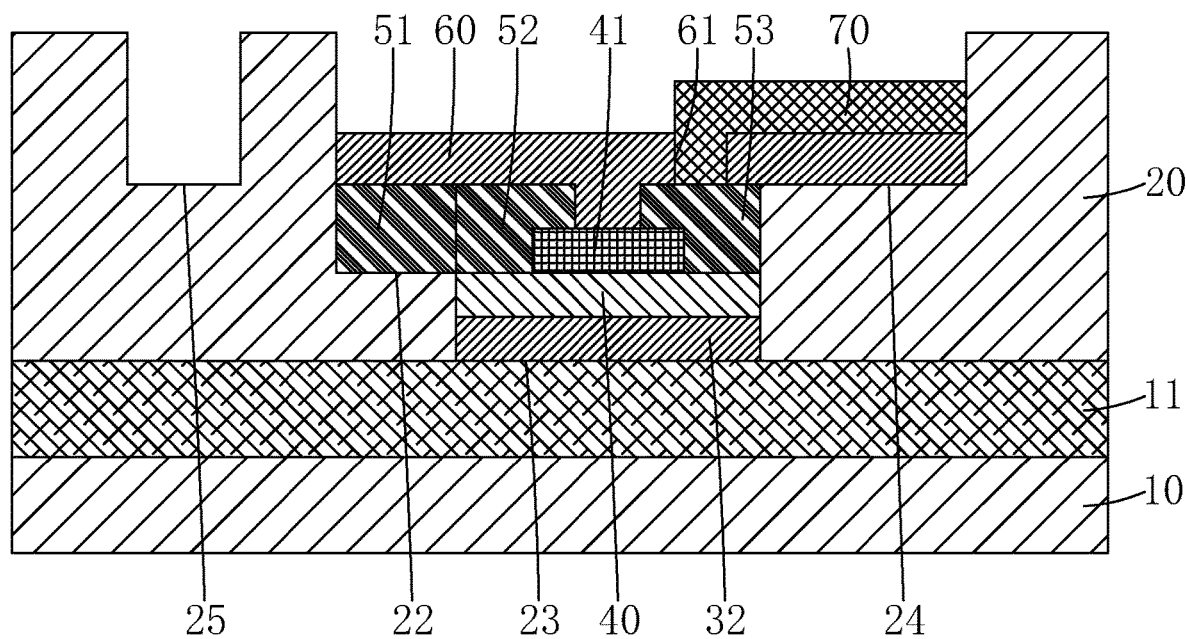

Step 3: ash shown in FIG. 5 and FIG. 6, forming a scan line 31 in each first groove 21, forming a gate 32 in the third groove 23, the gate 32 being connected to the scan line 31;

forming a gate insulation layer 40 on the scan line 31 and the gate 32;

forming an active layer 41 on the gate insulation layer 40 at location corresponding to above the gate 32;

forming a data line 51 in each second groove 22, forming a source 52 and a drain 53 in the third groove 23, the source connected to the data line 51, the source 52 and the drain 53 connected respectively to the two sides of the active layer 41;

forming a passivation layer 60 on the data line 51, the source 52, the drain 53, the active layer 41 and bottom of the fourth groove 24, forming a first via 61 on the passivation layer 60 at location corresponding to above the drain 53;

forming a pixel electrode 70 on the passivation layer 60 at location corresponding to above the bottom of the fourth groove 24, the pixel electrode 70 contacting the drain 53 through the first via 61.

Specifically, the total height of the structure formed in each groove of the first groove 21, the second grove 22, the third groove 23 and the fourth groove 24 is less than the depth of each corresponding groove.

Figure 7:
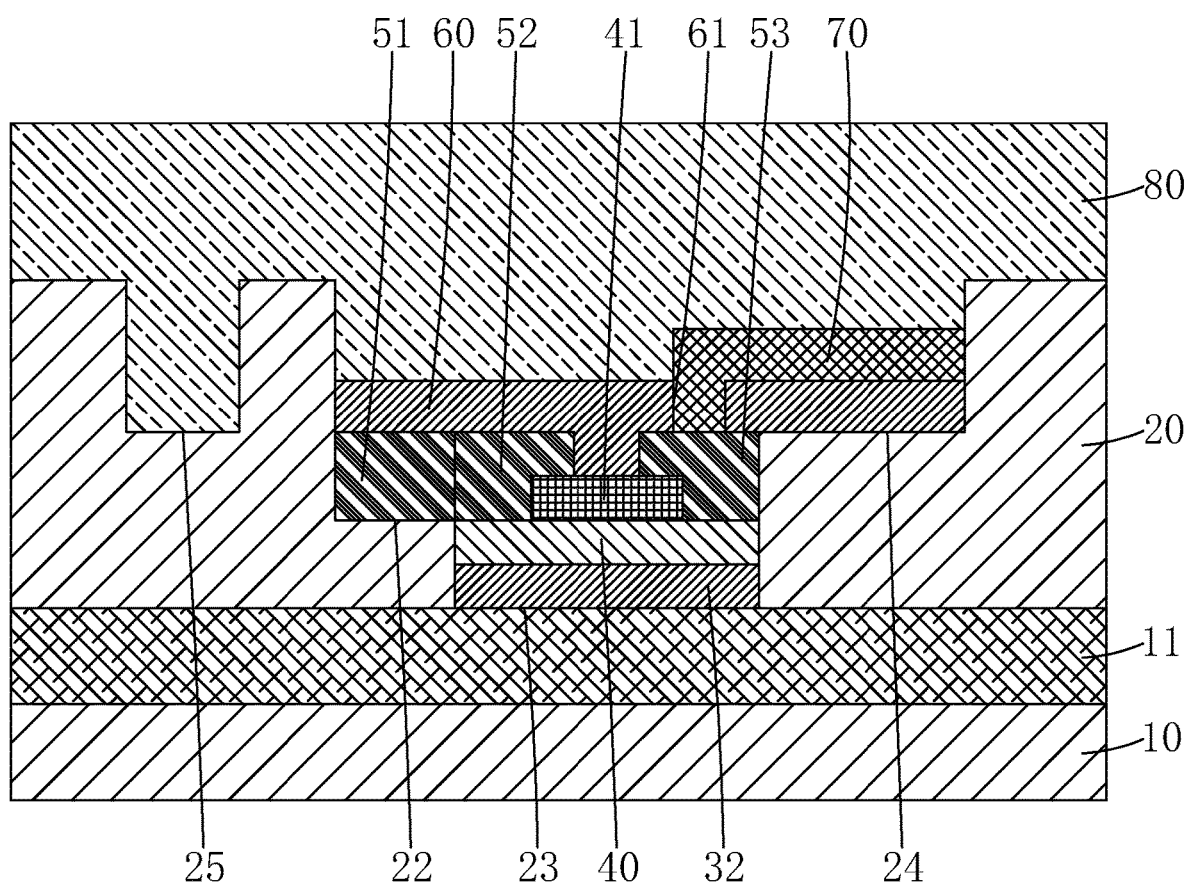
FIG. 7 and FIG. 8 are schematic views showing Step 4 of the manufacturing method of flexible TFT substrate provided by an embodiment of the present invention.

Step 4: as shown in FIG. 7, coating a third organic material on the first organic layer 20 to form a second organic layer 80.

Specifically, the third organic material comprises respectively at least one of polycarbonate (PC), polyethylene terephthalate (PET), polyethylene naphthalate (PEN), polyether resin (PES), and polyimide (PI); and preferably, the third organic material comprises polyimide (PI).

Specifically, the grooves disposed on the first organic layer 20 correspond to the recessed structures, and the areas between the grooves on the first organic layer 20 correspond to the raised structures. As a result, a plurality of recessed structures and a plurality of raised structures are formed on the first organic layer 20. Hence, by coating the second organic layer 80 on the first organic layer 20, the second organic layer 80 forms a plurality of raised structures and a plurality of recessed structures at the locations respectively corresponding to the recessed structures and raised structures of the first organic layer 20. As such, the bonding between the first organic layer 20 and the second organic layer 80 is tighter, and the tightly bonded first and second organic layers 20, 80 form an effective protection for the TFT components sandwiched between the two to prevent breaking wires, TFT component peeling and leaking light, enhance flexible TFT substrate quality and prolongs lifespan of flexible TFT substrate.

Figure 8:
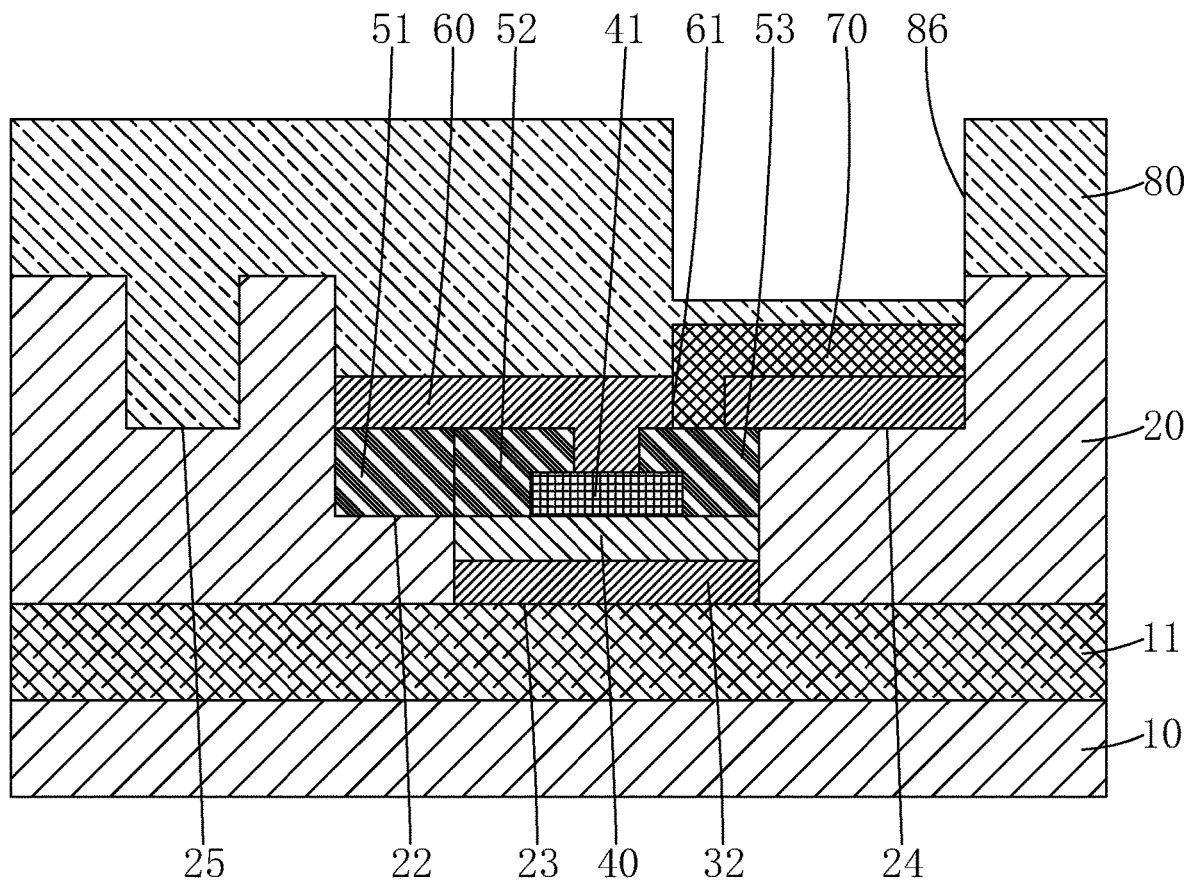

Preferably, as shown in FIG. 8, Step 4 further comprises:
performing patterning on the second organic layer 80 with a halftone mask (not shown) to form a sixth groove 86 on the second organic layer 80 at location corresponding to above the pixel electrode 70, thinning the thickness of the second organic layer 80 above the pixel electrode 70. As such, when the flexible TFT substrate of the present invention is applied to the LCD display panel, the electrical field strength above the pixel electrode 70 is enhanced to effectively control the rotation of the LC molecules.

Figure 9:
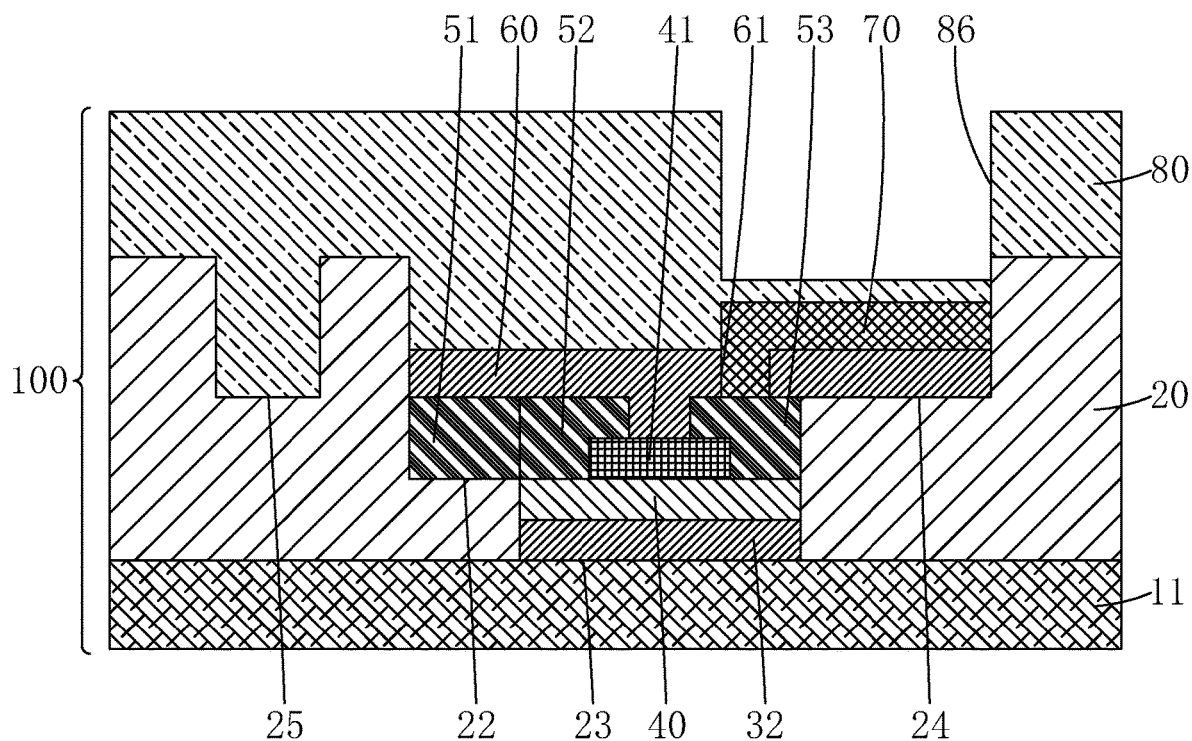
FIG. 9 is a schematic view showing Step 5 of the manufacturing method of flexible TFT substrate and the structure of the flexible TFT substrate provided by an embodiment of the present invention.

Step 5: as shown in FIG. 9, peeling the flexible base 11 from the rigid substrate 10 to obtain a flexible TFT substrate 100.

Preferably, Step 5 uses a laser lift off (LLO) process to peel the flexible base 11 from the rigid substrate 10.

The above manufacturing method of flexible TFT substrate forms a flexible base 11 and a first organic layer 20 on the rigid substrate 10 and forms a plurality of grooves on the first organic layer 20, manufactures the TFT devices in the grooves and then forms a second organic layer 80 on the first organic layer 20, finally peels the flexible base 11 from the rigid substrate 10 to obtain a flexible TFT substrate 100, wherein because a plurality of grooves is disposed in the first organic layer 20, a plurality of recessed structures and a plurality of raised structures are formed on the first organic layer 20 so that the second organic layer 80 and the first organic layer 20 are engaged with each other and bonded tightly, and protects the TFT devices sandwiched between the two to prevent the breaking wires, TFT peeling, and leaking light in the bending process, to enhance the flexible TFT substrate quality to prolong the lifespan of flexible TFT substrate.

Referring to FIG. 9, based on the above manufacturing method of flexible TFT substrate, the present invention also provides a flexible TFT substrate 100, which comprises: a flexible base 11, a first organic layer 20 disposed on the flexible base 11, and a second organic layer 80 disposed on the first organic layer 20.

The first organic layer 20 is disposed with a plurality of first grooves 21, a plurality of second grooves 22, a plurality of third grooves 23 and a plurality of fourth grooves 24; wherein the first grooves 21 intersect with the second grooves 22, the third grooves 23 are connected respectively to the first grooves 21 and the second grooves 22, and the fourth grooves 24 are connected to the third grooves 23.

The inside of the third groove 23 is disposed with a gate 32, gate insulation layer 40, an active layer 41, a source 52 and a drain 53, and a passivation layer 60 from the bottom up in a stack structure, the active layer 41 is disposed corresponding to above the gate 32, the source 52 and the drain 53 contact the two sides of the active layer 41 respectively.

The inside of the first groove 21 is disposed with a scan line 31 and a gate insulation layer 40 from the bottom up in a stack structure, and the scan line 31 is connected to the gate 32.

The inside of the second groove 22 is disposed with a data line 51 and a passivation layer 60 from the bottom up in a stack structure, and the data line 51 is connected to the source 52.

The inside of the fourth groove 24 is disposed with a passivation layer 60 and a pixel electrode 70 the bottom up in a stack structure.

The passivation layer 60 is disposed with a first via 61 at location corresponding to above the drain 53, and the pixel electrode 70 contacts the drain 53 through the first via 61.

Specifically, the first grooves 21 and the second grooves 22 are both bar-shaped, and the first grooves 21 and the second grooves 22 intersect perpendicularly.

Specifically, the third grooves 23 and the fourth grooves 24 are round, triangular or polygonal.

Specifically, the bottoms of the first groove 21, the second groove 22, the third groove 23 and the fourth groove 24 are located in the first organic layer 20 or the interface between the flexible base 11 and the first organic layer 20, the first groove 21, the second groove 22, the third groove 23 and the fourth groove 24 have the same or different depth.

Preferably, the first groove 21 and the third groove 23 have the same depth, and the depth is greater than the depths of the second groove 22 and the fourth groove 24.

Specifically, the total height of the structure formed in each groove of the first groove 21, the second grove 22, the third groove 23 and the fourth groove 24 is less than the depth of each corresponding groove.

Specifically, a plurality of fifth grooves 25 is disposed on the first organic layer 20 to increase the number of recessed structures and raised structures.

Specifically, the fifth groove 25 is connected to none, one or more of the first groove 21, the second groove 22, the third groove 23 and the fourth groove 24, the bottom of the fifth groove 25 is located in the first organic layer 20 or the interface between the flexible base 11 and the first organic layer 20.

Specifically, and the fifth groove 25 has the same with none, one or more of the first groove 21, the second groove 22, the third groove 23 and the fourth groove 24.

Specifically, the fifth grooves 25 are round, triangular or polygonal.

Preferably, a sixth groove 86 is disposed on the second organic layer 80 at a location corresponding to above the pixel electrode 70.

Specifically, the flexible base 11, the first organic layer 20, and the second organic layer 80 are respectively made of at least one of polycarbonate (PC), polyethylene terephthalate (PET), polyethylene naphthalate (PEN), polyether resin (PES), and polyimide (PI).

Preferably, the flexible base 11, the first organic layer 20, and the second organic layer 80 all comprise polyimide (PI).

Preferably, the flexible base 11 and the first organic layer 20 are made of the same material so that the flexible base 11 and the first organic layer 20 can be manufactured in the same process to save process time.

The above flexible TFT substrate comprises a flexible base 11, a first organic layer 20 disposed on the flexible base 11, and a second organic layer 80 disposed on the first organic layer 20. The first organic layer 20 is disposed with a plurality of grooves, the grooves are disposed with the TFT devices in and a second organic layer 80 coves the first organic layer 20 and the TFT devices, wherein because a plurality of grooves is disposed in the first organic layer 20, a plurality of recessed structures and a plurality of raised structures are formed on the first organic layer 20 so that the second organic layer 80 and the first organic layer 20 are engaged with each other and bonded tightly, and protects the TFT devices sandwiched between the two to prevent the breaking wires, TFT peeling, and leaking light in the bending process, to enhance the flexible TFT substrate quality to prolong the lifespan of flexible TFT substrate.

In summary, the present invention provides a flexible TFT substrate and manufacturing method thereof. The method forms a flexible base and a first organic layer on the rigid substrate and forms a plurality of grooves, manufactures the TFT devices in the grooves and then forms a second organic layer on the first organic layer, finally peels the flexible base from the rigid substrate to obtain a flexible TFT substrate, wherein because a plurality of grooves is disposed in the first organic layer, a plurality of recessed structures and a plurality of raised structures are formed on the first organic layer so that the second organic layer and the first organic layer are engaged with each other and bonded tightly, and protects the TFT devices sandwiched between the two to prevent the breaking wires, TFT peeling, and leaking light in the bending process, to enhance the flexible TFT substrate quality to prolong the lifespan of flexible TFT substrate.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of flexible thin film transistor (TFT) substrate, which comprises:
    Step 1: providing a rigid substrate, coating a first organic material on the rigid substrate to form a flexible base;
    Step 2: coating a second organic material on the flexible base to form a first organic layer, performing patterning on the first organic layer with a halftone mask to form a plurality of first grooves, a plurality of second grooves, a plurality of third grooves and a plurality of fourth grooves; wherein the first grooves intersecting with the second grooves, the third grooves connected respectively to the first grooves and the second grooves, and the fourth grooves connected to the third grooves;
    Step 3: forming a scan line in each first groove, forming a gate in the third groove, the gate being connected to the scan line;
    forming a gate insulation layer on the scan line and the gate;
    forming an active layer on the gate insulation layer at location corresponding to above the gate;
    forming a data line in each second groove, forming a source and a drain in the third groove, the source connected to the data line, the source and the drain connected respectively to the two sides of the active layer;
    forming a passivation layer on the data line, the source, the drain, the active layer and bottom of the fourth groove, forming a first via on the passivation layer at location corresponding to above the drain;
    forming a pixel electrode on the passivation layer at location corresponding to above the bottom of the fourth groove, the pixel electrode contacting the drain through the first via;
    Step 4: coating a third organic material on the first organic layer to form a second organic layer;
    Step 5: peeling the flexible base from the rigid substrate to obtain a flexible TFT substrate.

2. The manufacturing method of flexible TFT substrate as claimed in claim 1, wherein the bottoms of the first groove, the second groove, the third groove and the fourth groove are located in the first organic layer or the interface between the flexible base and the first organic layer, the first groove, the second groove, the third groove and the fourth groove have the same or different depth.

3. The manufacturing method of flexible TFT substrate as claimed in claim 1, wherein Step 2 further comprises: forming a plurality of fifth grooves on the first organic layer, the fifth grooves being connected to none, one or more of the first groove, the second groove, the third groove and the fourth groove, the bottom of the fifth groove being located in the first organic layer or the interface between the flexible base and the first organic layer, and the fifth groove having the same with none, one or more of the first groove, the second groove, the third groove and the fourth groove.

4. The manufacturing method of flexible TFT substrate as claimed in claim 1, wherein the first organic material, the second organic material and the third organic material comprise respectively at least one of polycarbonate, polyethylene terephthalate, polyethylene naphthalate, polyether resin, and polyimide; and the first organic material is the same as the second organic material, the coating process in Step 1 is the same as the coating process in Step 2.

5. The manufacturing method of flexible TFT substrate as claimed in claim 1, wherein Step 4 further comprises; performing patterning on the second organic layer with a halftone mask to form a sixth groove on the second organic layer at location corresponding to above the pixel electrode, thinning the thickness of the second organic layer above the pixel electrode.

6. A manufacturing method of flexible thin film transistor (TFT) substrate, which comprises:

Step 1: providing a rigid substrate, coating a first organic material on the rigid substrate to form a flexible base;

Step 2: coating a second organic material on the flexible base to form a first organic layer, performing patterning on the first organic layer with a halftone mask to form a plurality of first grooves, a plurality of second grooves, a plurality of third grooves and a plurality of fourth grooves: wherein the first grooves intersecting with the second grooves, the third grooves connected respectively to the first grooves and the second grooves, and the fourth grooves connected to the third grooves;

Step 3: forming a scan line in each first groove, forming a gate in the third groove, the gate being connected to the scan line;

forming a gate insulation layer on the scan line and the gate;

forming an active layer on the gate insulation layer at location corresponding to above the gate;

forming a data line in each second groove, forming a source and a drain in the third groove, the source connected to the data line, the source and the drain connected respectively to the two sides of the active layer;

forming a passivation layer on the data line, the source, the drain, the active layer and bottom of the fourth groove, forming a first via on the passivation layer at location corresponding to above the drain;

forming a pixel electrode on the passivation layer at location corresponding to above the bottom of the fourth groove, the pixel electrode contacting the drain through the first via;

Step 4: coating a third organic material on the first organic layer to form a second organic layer;

Step 5: peeling the flexible base from the rigid substrate to obtain a flexible TFT substrate;

wherein the bottoms of the first groove, the second groove, the third groove and the fourth groove being located in the first organic layer or the interface between the flexible base and the first organic layer, the first groove, the second groove, the third groove and the fourth groove having the same or different depth;

wherein Step 2 further comprising: forming a plurality of fifth grooves on the first organic layer, the fifth grooves being connected to none, one or more of the first groove, the second groove, the third groove and the fourth groove, the bottom of the fifth groove being located in the first organic layer or the interface between the flexible base and the first organic layer, and the fifth groove having the same with none, one or more of the first groove, the second groove, the third groove and the fourth groove.

7. The manufacturing method of flexible TFT substrate as claimed in claim 6, wherein the first organic material, the second organic material and the third organic material comprise respectively at least one of polycarbonate, polyethylene terephthalate, polyethylene naphthalate, polyether resin, and polyimide; and the first organic material is the same as the second organic material, the coating process in Step 1 is the same as the coating process in Step 2.

8. The manufacturing method of flexible TFT substrate as claimed in claim 6, wherein Step 4 further comprises: performing patterning on the second organic layer with a halftone mask to form a sixth groove on the second organic layer at location corresponding to above the pixel electrode, thinning the thickness of the second organic layer above the pixel electrode.

* * * * *